(12) United States Patent
Watanabe et al.

(10) Patent No.: US 12,428,721 B2
(45) Date of Patent: Sep. 30, 2025

(54) FILM FORMING APPARATUS AND FILM FORMING METHOD

(71) Applicant: Tokyo Electron Limited, Tokyo (JP)

(72) Inventors: Naoki Watanabe, Yamanashi (JP); Tatsuo Hatano, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 117 days.

(21) Appl. No.: 17/956,562

(22) Filed: Sep. 29, 2022

(65) Prior Publication Data

US 2023/0097539 A1 Mar. 30, 2023

(30) Foreign Application Priority Data

Sep. 30, 2021 (JP) .................. 2021-161817

(51) Int. Cl.
*H01J 37/32* (2006.01)
*C23C 14/14* (2006.01)
*C23C 14/35* (2006.01)
*C23C 14/50* (2006.01)
*C23C 14/58* (2006.01)
*H01J 37/34* (2006.01)
*H01L 21/02* (2006.01)

(52) U.S. Cl.
CPC .......... *C23C 14/5853* (2013.01); *C23C 14/14* (2013.01); *C23C 14/35* (2013.01); *C23C 14/505* (2013.01); *C23C 14/586* (2013.01); *H01J 37/32715* (2013.01); *H01J 37/3426* (2013.01); *H01J 2237/20214* (2013.01); *H01J 2237/332* (2013.01); *H01L 21/02164* (2013.01); *H01L 21/0217* (2013.01); *H01L 21/02266* (2013.01)

(58) Field of Classification Search
None
See application file for complete search history.

(56) References Cited

U.S. PATENT DOCUMENTS

| 4,851,095 A | * | 7/1989 | Scobey | C23C 14/56 204/192.15 |
| 6,365,010 B1 | * | 4/2002 | Hollars | C23C 14/35 204/192.12 |
| 7,153,399 B2 | * | 12/2006 | Smith | C23C 14/505 204/192.12 |

(Continued)

FOREIGN PATENT DOCUMENTS

JP H10-298752 A 11/1998

*Primary Examiner* — Jason Berman
(74) *Attorney, Agent, or Firm* — Fenwick & West LLP

(57) ABSTRACT

A film forming apparatus comprising: a processing container for accommodating a plurality of substrates, a substrate holder provided in the processing container and configured to hold the substrates such that the plurality of substrates are arranged along a circumferential direction; a rotating and revolving mechanism configured to rotate the plurality of substrates on the substrate holder and revolve the plurality of substrates on the substrate holder along the circumferential direction; and a sputtered particle emitting mechanism configured to emit sputtered particles to the plurality of substrates held by the substrate holder. Sputtering film formation is performed by emitting the sputtered particles from the sputtered particle emitting mechanism while rotating and revolving the plurality of substrates held by the substrate holder using the rotating and revolving mechanism.

18 Claims, 13 Drawing Sheets

(56) References Cited

U.S. PATENT DOCUMENTS

| | | | |
|---|---|---|---|
| 2004/0182701 A1* | 9/2004 | Miyamura | C23C 14/568 204/192.12 |
| 2007/0218702 A1* | 9/2007 | Shimizu | C23C 16/36 438/758 |
| 2018/0087142 A1* | 3/2018 | Pistner | C23C 14/547 |

* cited by examiner

*FIG.10A*     *FIG.10B*     *FIG.10C*
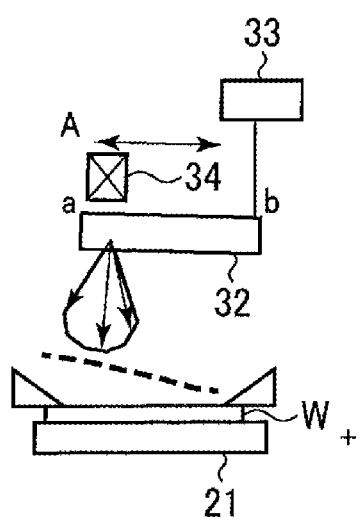
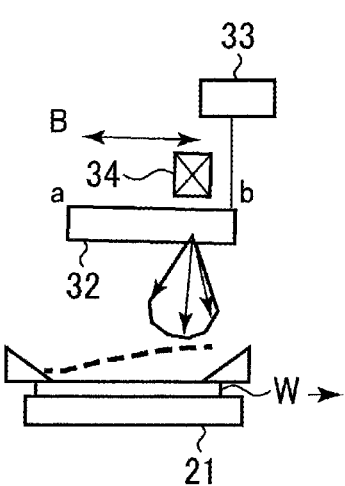
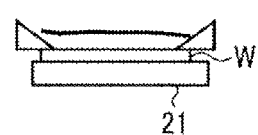

FILM FORMING APPARATUS AND FILM FORMING METHOD

CROSS-REFERENCE TO RELATED APPLICATIONS

This application claims priority to Japanese Patent Application No. 2021-161817 filed on Sep. 30, 2021, the entire contents of which are incorporated herein by reference.

TECHNICAL FIELD

The present disclosure relates to a film forming apparatus and a film forming method.

BACKGROUND

In the manufacture of electronic devices such as semiconductor devices, a film forming process for forming a film on a substrate is performed. As a film forming apparatus used for the film forming process, a sputtering film forming apparatus is known which emits sputtered particles from a target and deposits the sputtered particles on a substrate.

As a technique for performing such sputtering film formation, Japanese Laid-open Patent Publication No. H10-298752 proposes a film forming apparatus in which one or more substrate holders for holding two or more substrates are provided at position where a film is formed by sputtered particles from a target.

SUMMARY

The present disclosure provides a film forming apparatus and a film forming method capable of achieving both high productivity and good controllability.

In accordance with an aspect of the present disclosure, there is provided a film forming apparatus comprising: a processing container for accommodating a plurality of substrates, a substrate holder provided in the processing container and configured to hold the substrates such that the plurality of substrates are arranged along a circumferential direction; a rotating and revolving mechanism configured to rotate the plurality of substrates on the substrate holder and revolve the plurality of substrates on the substrate holder along the circumferential direction; and a sputtered particle emitting mechanism configured to emit sputtered particles to the plurality of substrates held by the substrate holder. Sputtering film formation is performed by emitting the sputtered particles from the sputtered particle emitting mechanism while rotating and revolving the plurality of substrates held by the substrate holder using the rotating and revolving mechanism.

BRIEF DESCRIPTION OF THE DRAWINGS

The objects and features of the present disclosure will become apparent from the following description of embodiments, given in conjunction with the accompanying drawings, in which:

FIGS. 10A to 10C are schematic diagrams for explaining the relationship between an initial position of the magnet and film thickness distribution for the targets A and B, and film thickness adjustment;

DETAILED DESCRIPTION

Hereinafter, embodiments will be described in detail with reference to the accompanying drawings.

Figure 1:
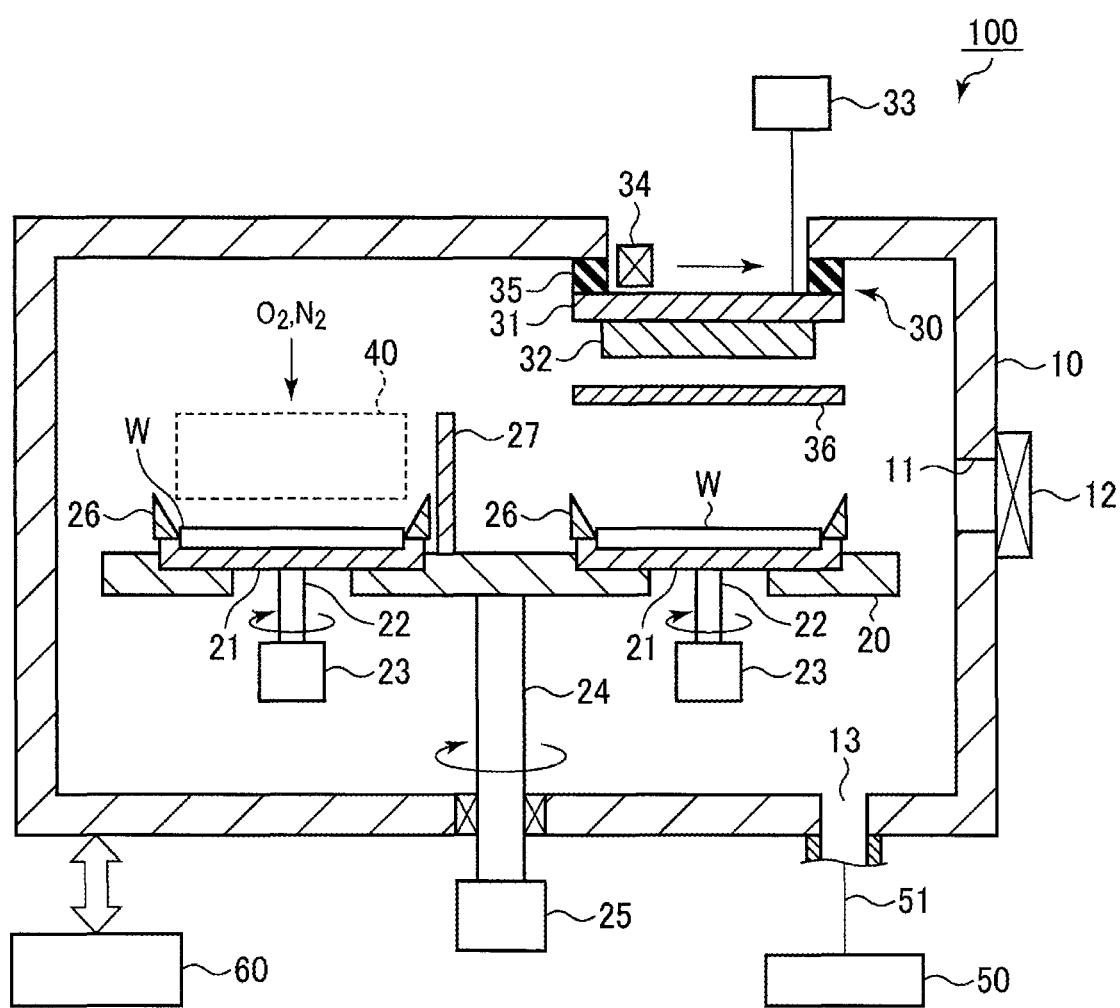
FIG. 1 is a longitudinal cross-sectional view schematically showing a film forming apparatus according to an embodiment.
Figure 2:
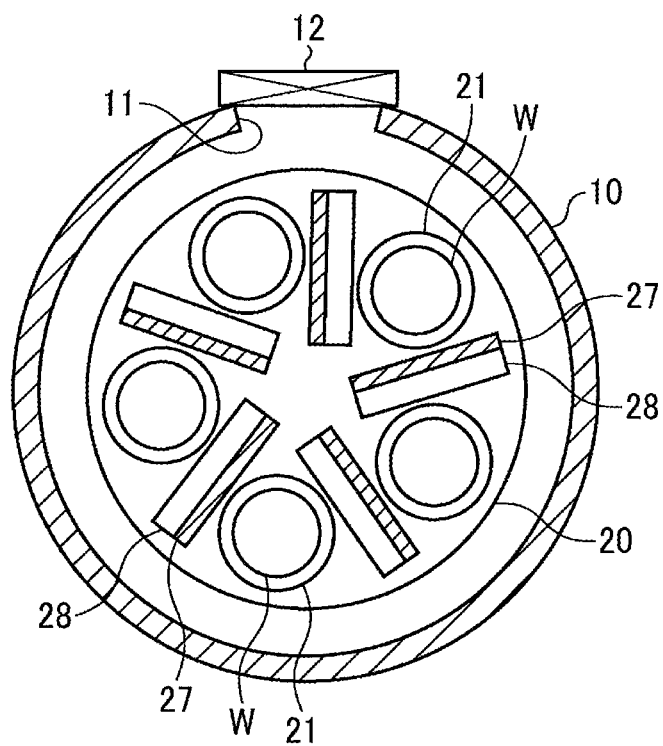
FIG. 2 is a horizontal cross-sectional view schematically showing a lower portion of the film forming apparatus according to the embodiment.
Figure 3:
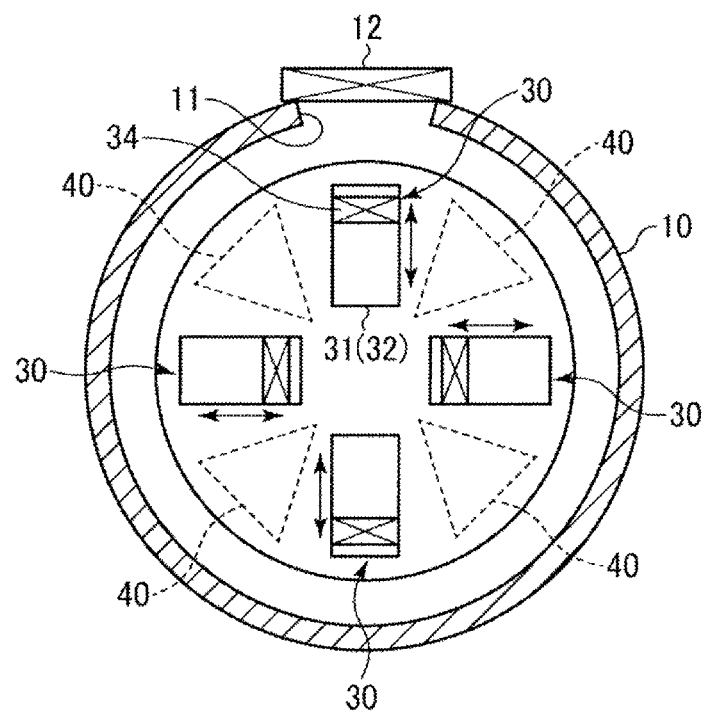
FIG. 3 is a horizontal cross-sectional view of an upper portion of the film forming apparatus according to the embodiment.

FIG. 1 is a longitudinal cross-sectional view schematically showing a film forming apparatus according to an embodiment, FIG. 2 is a horizontal cross-sectional view schematically showing a lower portion of the film forming apparatus according to the embodiment, and FIG. 3 is a horizontal cross-sectional view of an upper portion of the film forming apparatus according to the embodiment.

A film forming apparatus 100 is configured as a sputtering film forming apparatus for performing sputtering film formation on a plurality of substrates. The film forming apparatus 100 includes a processing container 10 that defines a processing chamber in which film forming processing is performed and that is held in vacuum.

A loading/unloading port 11 for loading/unloading a substrate W is formed on a side surface of the processing container 10, and the loading/unloading port 11 can be opened and closed by a gate valve 12. A transfer mechanism (not shown) of a vacuum transfer chamber (not shown)

provided adjacent to the processing container 10 loads and unloads the substrate W into and from the processing container 10.

An exhaust port 13 is formed at a bottom portion of the processing container 10, and an exhaust device 50 is connected to the exhaust port 13 via an exhaust line 51. The exhaust device 50 includes a pressure control valve and a vacuum pump, and evacuates the inside of the processing container 10 to control the pressure therein to a predetermined vacuum pressure.

A rotary table 20 is horizontally disposed in the processing container 10, and a plurality of stages 21 on which the substrates W are placed are provided on the rotary table 20 at regular intervals along the circumferential direction. In this example, as shown in FIG. 2, the number of stages 21 is five. The rotary table 20 and the stages 21 function as a substrate holding mechanism.

The stage 21 is provided with a temperature control mechanism (not shown) that heats or cools the stage 21, and for example, the temperature of the stage 21 can be controlled within a range from room temperature to 350° C. By providing the stage 21 with a cooling mechanism, it is possible to prevent the temperature of the substrate W from rising due to heat input from sputtered particles during film formation. Further, by adjusting the temperature of the stage 21 to a high temperature of 100° C. to 350° C. suitable for a high temperature process, a high-quality film can be formed. Further, an electrostatic chuck for electrostatically attracting the substrate W may be provided. The electrostatic chuck is particularly effective for the high temperature process. Further, the stage 21 is provided with elevating pins (not shown) for transferring the substrate W.

A rotation shaft 22 extending downward is connected to the center of the lower surface of the stage 21, and the rotation shaft 22 can be rotated by a rotation mechanism 23 such as a motor. A bearing (not shown), for example, is provided between the rotary table 20 and the stage 21. By rotating the stage 21 via the rotation shaft 22 by the rotation mechanism 23, the substrate W placed on the stage 21 rotates. A mask member 26 is provided around the stage 21 so as to surround the substrate W.

A rotation shaft 24 extending downward is connected to the center of the rotary table 20, and the rotation shaft 24 is rotatable by a rotation mechanism 25 such as a motor provided outside the processing container 10. By rotating the rotary table 20 via the rotation shaft 24 by the rotation mechanism 25, the substrate W placed on the stage 21 is revolved along the arrangement direction of the stages 21.

In other words, the rotation mechanisms 23 and 25 enable the substrate W placed on the stage 21 to rotate and revolve, and function as a rotating and revolving mechanism. This rotating and revolving mechanism allows the substrate W to revolve while being continuously rotated.

Figure 4:
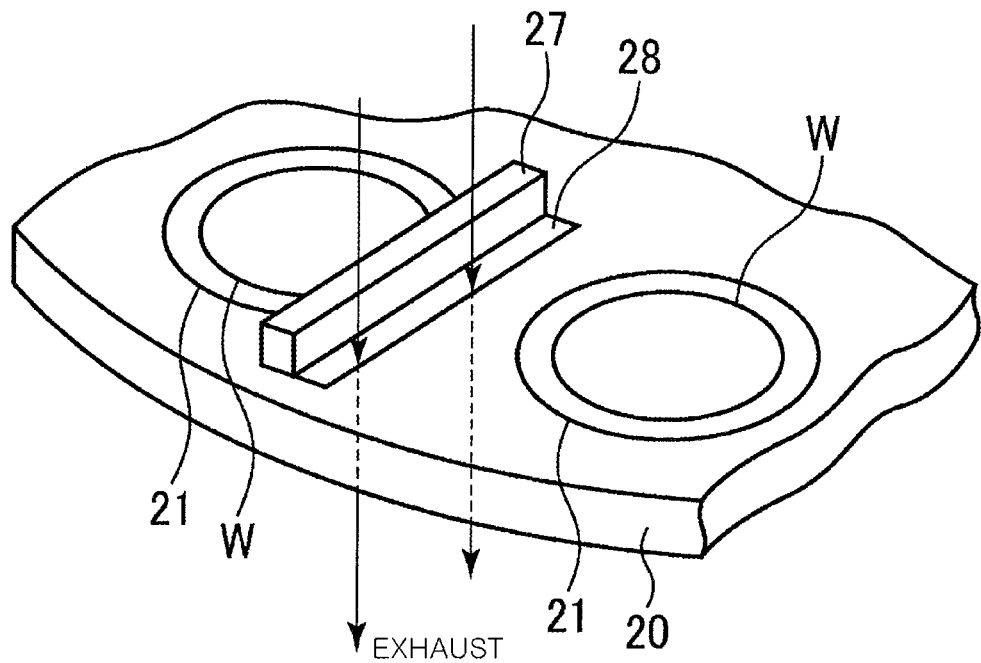
FIG. 4 is a perspective view for explaining a separation wall and an exhaust slit provided at a stage.

A separation wall 27 and an exhaust slit 28 are provided between adjacent stages 21 on the rotary table 20. As shown in FIG. 4, the space between the stages 21 is exhausted through the exhaust slit 28 while physically separating the adjacent stages 21 by the separation wall 27, so that the atmospheres of the adjacent substrates W can be separated.

Above the rotary table 20, as shown in FIG. 3, four cathodes 30 for emitting sputtered particles are provided at equal intervals. Between the adjacent cathodes 30, four reaction treatment areas 40 in which reaction treatment such as oxidation treatment or nitriding treatment is performed are provided. The area under the cathodes 30 serves as a film forming area.

The four cathodes 30 are configured as a sputtered particle emitting mechanism and provided on a top wall of the processing container 10. The cathode 30 has a target holder 31, a target 32 held by the target holder 31, a power supply 33 for applying voltage to the target 32 via the target holder 31, and a magnet 34. In this example, an example in which the target 32 is provided parallel to the substrate W is shown.

The target holder 31 is made of a conductive material and attached to the top wall of the processing container 10 via an insulating member 35.

The target 32 has a rectangular shape, is made of a material containing constituent elements of a film to be formed, and may be made of a conductive material or a dielectric material. The target 32 is held by the target holder 31.

The power supply 33 is electrically connected to the target holder 31. The power supply 33 may be a DC power supply when the target 32 is made of a conductive material, or may be a high-frequency power supply when the target 32 is made of a dielectric material.

The magnet 34 is provided on a back surface side of the target holder 31. The magnet 34 is for applying a leakage magnetic field to the target 32 to perform magnetron sputtering. The magnet 34 is configured to oscillate along the back surface of the target holder 31 by a magnet driving device (not shown). In this example, the target 32 is disposed so that its long sides are in a radial direction, and the magnet 34 is configured to oscillate in the radial direction along the long side direction of the target 32.

Figure 5:
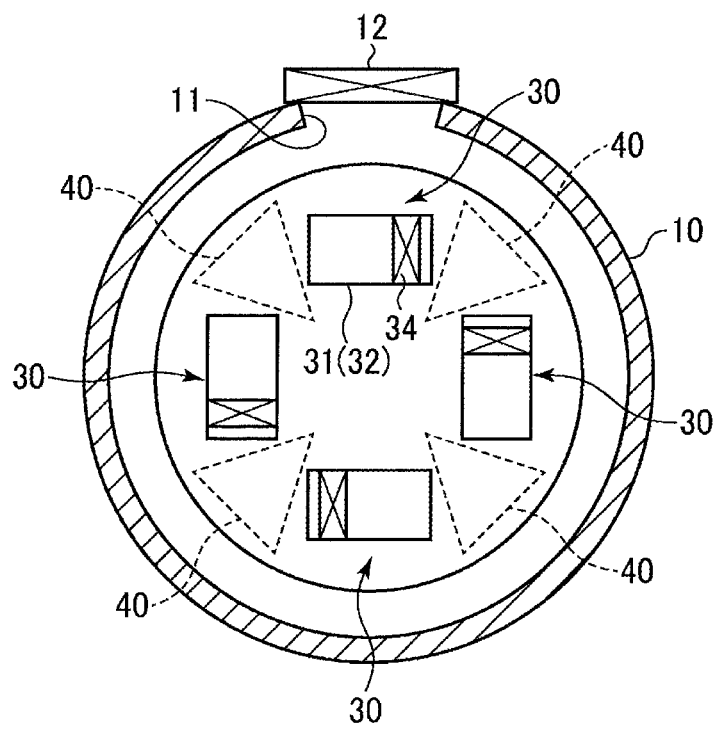
FIG. 5 is a horizontal cross-sectional view showing another example of target arrangement.

The arrangement position and orientation of the target 32 are arbitrary, and are set depending on a pattern formed on the substrate W or the like. As shown in FIG. 5, the target 32 may be (horizontally) arranged so that the longitudinal direction thereof is orthogonal to the radial direction. In this case, the magnets 34 is oscillated perpendicularly to the radial direction.

A sputtering gas such as Ar gas is supplied from a gas supply (not shown) to an area directly below the cathode 30 in the processing container 10, the sputtering gas is dissociated around the target 32 by applying a voltage from the power supply 33 to the target 32 via the target holder 31. At this time, the leakage magnetic field of the magnet 34 is exerted around the targets 32, so that magnetron plasma is intensively formed around the target 32. In this state, positive ions in the plasma collide with the target 32, and sputtered particles are emitted from the target 32. The sputtered particles are deposited on the substrates W passing under the target 32 to form a desired film on the substrates W. Although the film to be formed is not particularly limited, an Si film may be formed, for example.

A shutter 36 capable of opening and closing the target 32 is provided under the target 32. The shutter 36 will be described in detail later.

The reaction treatment area 40 is an area in which a reaction gas atmosphere is formed by supplying a reaction gas, e.g., an oxidizing gas such as $O_2$ gas or a nitriding gas such as $N_2$ gas from a gas supply (not shown). The substrate W on the stage 21, on which a film is formed by sputtering film formation in the film forming area under the cathode 30, passes through the reaction treatment area 40 to undergo the reaction treatment such as oxidation treatment or nitriding treatment. When the film formed by sputtering is an Si film, for example, the Si film is oxidized into an $SiO_2$ film by performing the oxidation treatment or is nitrided into an SiN film by performing the nitriding treatment in the reaction treatment area 40.

The oxidizing gas used when the reaction treatment is oxidation treatment includes $O_3$, $N_2O$, $H_2O$, $CH_2OH$, $C_2H_5OH$, CO, and $CO_2$, other than $O_2$ gas, and the nitriding gas used when the reaction treatment is nitriding treatment includes $NH_3$, $N_2O$, and organic amine compounds such as $CH_3NH_2$, $(CH_3)_2NH$, and $(CH_3)_3N$, other than $N_2$ gas.

The method of supplying the gas to the reaction treatment area 40 is not particularly limited, and the gas may be supplied from above or from the side, or may be supplied using a gas introducing member such as a shower head. Further, the reaction treatment may be performed using appropriate plasma.

By emitting sputtered particles from the cathode 30 while rotating the stage 21 and the rotary table 20 to rotate and revolve the substrate W, a desired film is uniformly formed on the substrate W passing through an area under the cathode 30. At that time, by passing the substrate W through the reaction treatment area 40, reaction treatment such as oxidation treatment or nitriding treatment can be performed on the film formed by the sputtering film formation.

For example, in the case of alternately performing oxidation treatment and nitriding treatment in the reaction treatment area, by sequentially repeating Si film formation in the film forming area, oxidation treatment in the reaction treatment area, Si film formation in the film forming area, and nitriding treatment in the reaction treatment area, the $SiO_2$ film and the SiN film can be alternately formed.

As described above, the film forming process is performed while rotating and revolving the substrate W. In this case, the rotation speed can be set to 20 rpm to 120 rpm, and the revolution speed can be set to 5 rpm to 30 rpm. Moreover, from the viewpoint of improving the uniformity of the film, it is preferable that the rotation speed is an integral multiple of the revolution speed. When the four cathodes 30 are provided as in this example, it is preferable that the rotation speed of the substrate W is 4×n (where n is an integer) times the revolution speed.

Figure 6A:
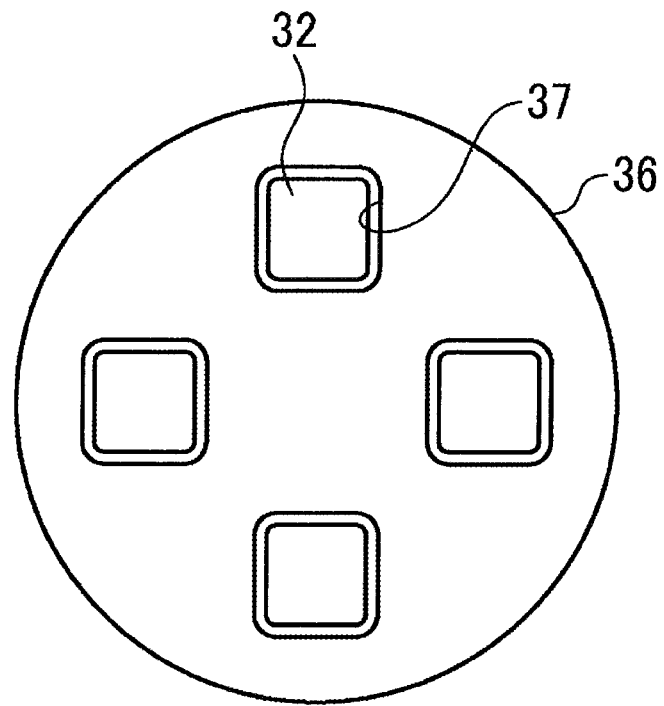
FIGS. 6A and 6B are respectively a bottom view and a cross-sectional view for explaining a shutter for opening and closing a target, showing a state in which the shutter is opened.
Figure 6B:
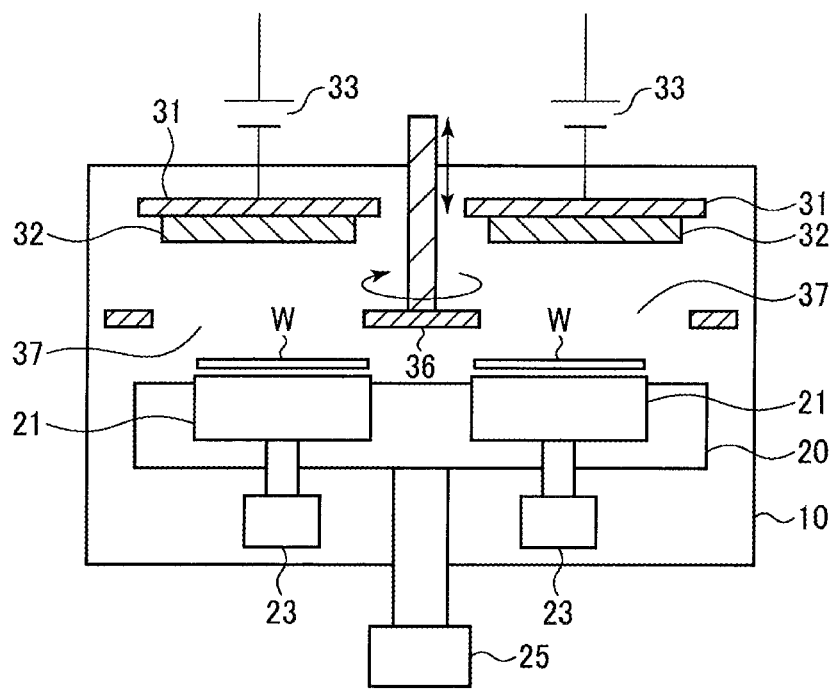
Figure 7A:
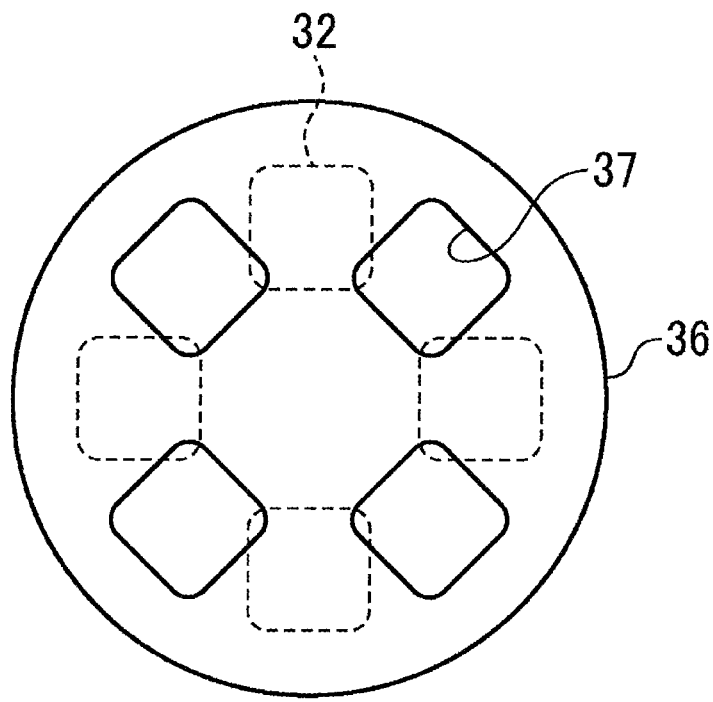
FIGS. 7A and 7B are respectively a bottom view and a cross-sectional view for explaining the shutter for opening and closing the target, showing a state in which the shutter is closed.
Figure 7B:
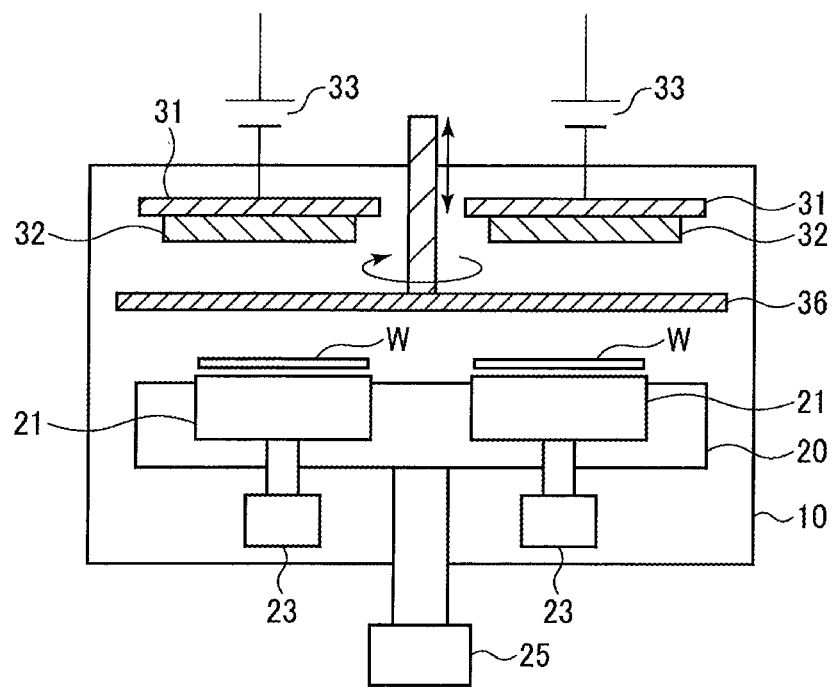

The shutter 36 described above has four openings 37 as shown in the bottom view of FIG. 6A, and is provided to be rotatable and vertically movable as shown in the cross-sectional view of FIG. 6B. FIGS. 6A and 6B show the case where the four openings 37 are aligned with the targets 32 and the shutter 36 is opened, and the sputtering film formation is performed in this state. FIGS. 7A and 7B show the case where the shutter 36 is closed, in which the shutter 36 is rotated from the position shown in FIGS. 6A and 6B and the openings 37 are shifted from the targets 32, and the reaction treatment such as oxidation treatment or nitriding treatment is performed in this state. Accordingly, the oxidation or nitriding on the surface of the target 32 can be suppressed. Further, the targets 32 can be pre-sputtered in a state where the shutter 36 is closed.

The film forming apparatus 100 includes a controller 60 composed of a computer. The controller 60 controls each component of the film forming apparatus 100, for example, the rotation mechanisms 23 and 25, the power supply 33, the driving device for the magnet 34, the gas supply, the exhaust device 50, and the like. The controller 60 includes a main controller composed of a CPU that actually controls them, an input device, an output device, a display device, and a storage device. The storage device stores parameters of various processes performed by the film forming apparatus 100, and has a storage medium storing a program for controlling the processes performed by the film forming apparatus 100, that is, a processing recipe. The main controller of the controller 60 invoke a predetermined processing recipe stored in the storage medium, and causes the film forming apparatus 100 to perform a film forming process based on the processing recipe.

Next, the film forming process operation of the film forming apparatus 100 configured as described above will be described. The following processes are performed under the control of the controller 60.

First, while the gate valve 12 is opened and the rotary table 20 is rotated, the substrates W are sequentially placed on the stages 21 in the processing container 10 by the transfer mechanism of the vacuum transfer chamber. The placing of the substrates W is performed in a state in which the elevating pins of each stage 21 are protruded from the placing surface. Next, the transfer mechanism of the vacuum transfer chamber is returned and the gate valve 12 is closed.

Next, the inside of the processing container 10 is controlled to a desired pressure, and the stage 21 and the rotary table 20 are rotated to cause the substrate W to rotate and revolve.

Then, first, sputtering film formation is performed on the substrate W passing through the film forming area under the cathode 30. The sputtering film formation is performed by introducing a sputtering gas such as Ar gas into the processing container 10 and applying a voltage to the target 32 of the cathode 30 while oscillating the magnet 34. When the voltage from the power supply 33 is applied to the target 32, the sputtering gas is dissociated around the target 32, and the leakage magnetic field of the magnet 34 is exerted around the target 32, so that magnetron plasma is produced intensively around the target 32. In this state, positive ions in the plasma collide with the target 32, and sputtered particles are emitted from the target 32 and deposited on the substrates W passing under the target 32 to form a film.

The substrate W on which the film has been formed by sputtering after passing through one cathode 30 then passes through the reaction treatment area 40 and undergoes reaction treatment such as oxidation treatment and nitriding treatment. In the reaction treatment area 40, oxidation treatment or nitriding treatment is performed by supplying a reaction gas such as an oxidizing gas or a nitriding gas to the substrate W, for example.

After passing through one reaction treatment area 40, the substrate W passes through next film forming area under the cathode 30, a film is formed in the same manner, and the reaction treatment is performed by passing through next reaction treatment area. In this manner, the sputtering film formation and the reaction treatment are alternately and repeatedly performed on the substrate W.

As described above, in this embodiment, the sputtering film formation is performed on a plurality of (five in this example) substrates W while the substrates W rotate and revolve. As a result, since the film forming process is performed on the plurality of substrates W at the same time, high productivity can be obtained, and since the substrates W rotate and revolve and pass under the target 32, uniform sputtering film formation can be performed with good controllability.

In addition, in the present embodiment, the reaction treatment such as oxidation treatment and nitriding treatment can be performed on the substrate W after the sputtering film formation in the reaction treatment area 40, so that a desired reaction can be caused very easily on the film formed by sputtering.

Japanese Laid-open Patent Publication No. H10-298752 discloses a technique for performing sputtering film formation by holding a plurality of substrates on a substrate holder, but does not include the viewpoint of achieving both high productivity and good controllability. Further, in the conventional batch-type sputtering apparatus, a plurality of substrates are stacked and processed, so the productivity is high, but process controllability such as film thickness distribution is insufficient. In addition, although a single-wafer sputtering apparatus has high process controllability, it has lower productivity than the batch-type sputtering apparatus. In order to improve productivity, it is required to increase the number of chambers. In that case, the increase in footprint makes it difficult to reduce costs.

On the other hand, in the present embodiment, as described above, both high productivity and good process controllability can be achieved.

In the case of magnetron sputtering using the magnet 34 as in the present embodiment, the thickness of the film deposited on the surface of the substrate W varies depending on the position of the magnet, and the film thickness increases immediately under the magnet 34. Therefore, the film thickness distribution may occur according to the position of the magnet 34. Such a film thickness distribution according to the position of the magnet 34 can be suppressed by synchronizing the oscillation of the magnet 34 and the revolution of the substrate W.

For example, consider the case where the four targets 32 are A to D, the substrate W revolves ¼ turn (90°) from the target A to the adjacent target B, and the magnet 34 oscillates from one end "a" to the other end "b" in the longitudinal direction of the target. In this case, the oscillation of the magnet 34 and the revolution of the substrate W can be synchronized, as shown in FIGS. 8A to 8D, for example. While the substrate W revolves from the target A to the target B, the substrate W rotates n times (n is an integer).

Figure 8A:
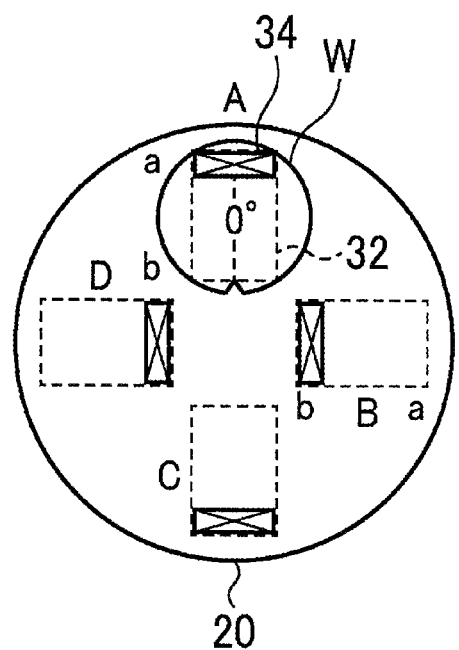
FIGS. 8A to 8D are schematic diagrams showing an example in which oscillation of a magnet and revolution of a substrate are synchronized.
Figure 8B:
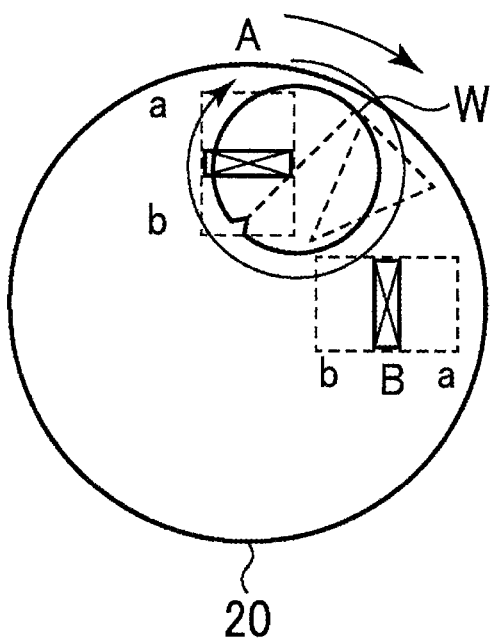
Figure 8C:
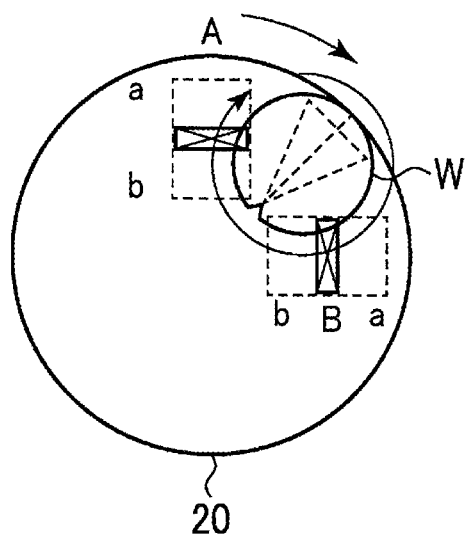
Figure 8D:
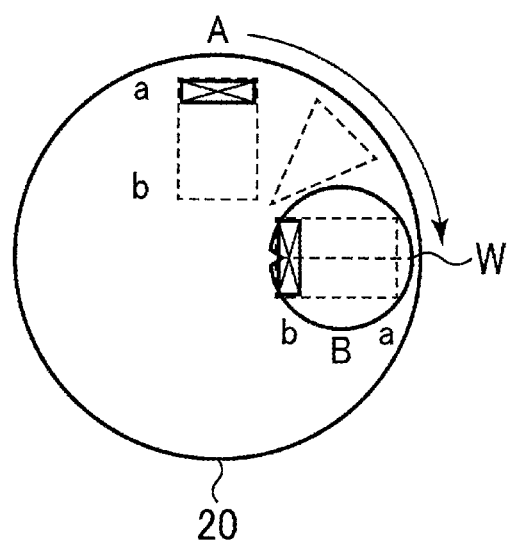

Specifically, in the initial state of FIG. 8A, the substrate W is positioned directly under the target A, the magnet 34 of the target A is positioned on the side of one end "a", and the magnet 34 of the target B is positioned on the side of the other end "b". From this state, while the magnet 34 is oscillated in synchronization with the revolution of the substrate W, the substrate W revolves to a position directly under the target B of FIG. 8D after passing through the position of FIG. 8B and the position of the reaction treatment area 40 of FIG. 8C. At the position of FIG. 8D, the positions of the magnets 34 of the targets A and B are the same as those in the initial state.

Figure 9:
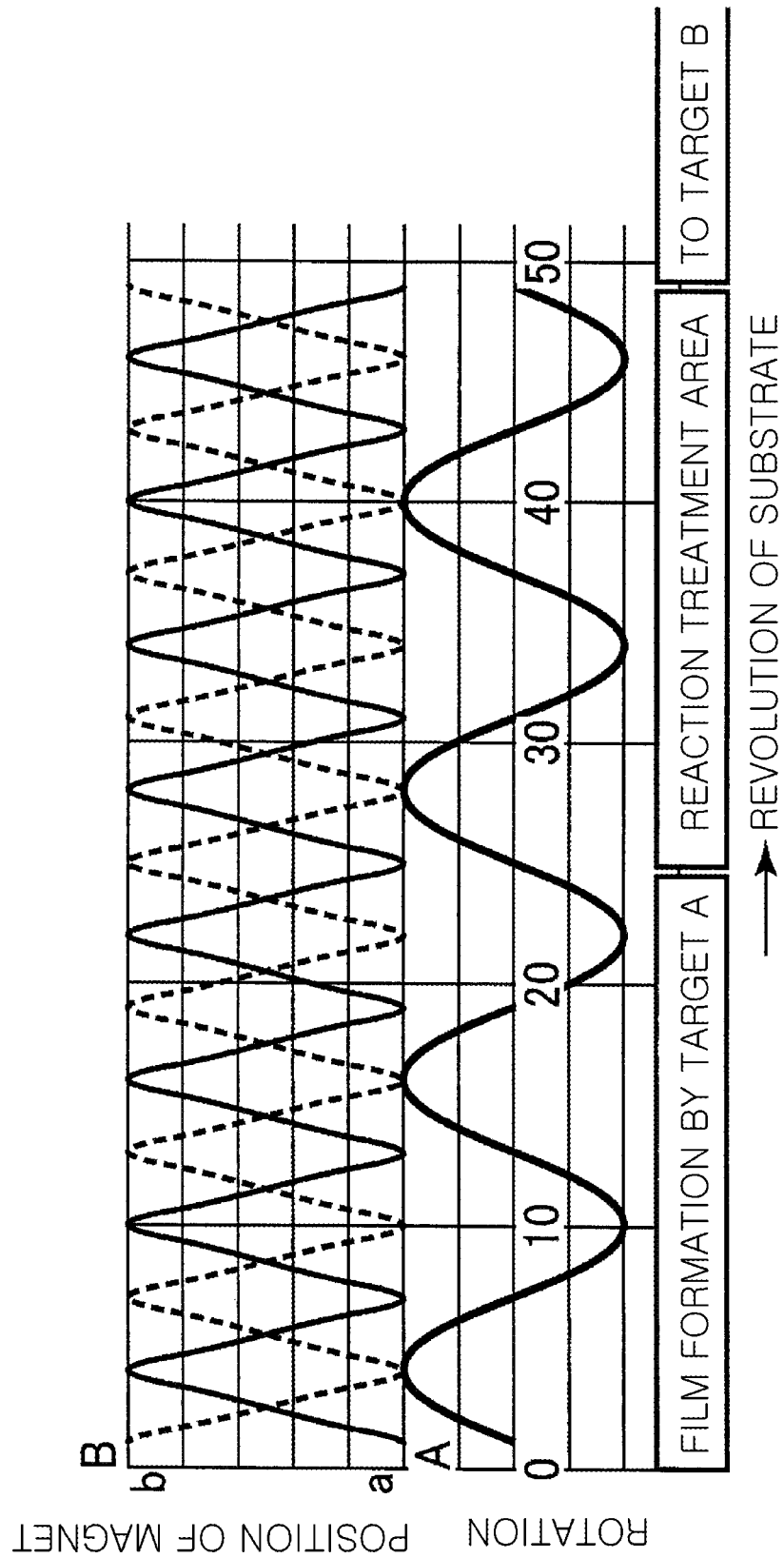
FIG. 9 is a diagram showing a detailed timing example of oscillation of the magnet and rotation and revolution of the substrate.
Figure 11A:
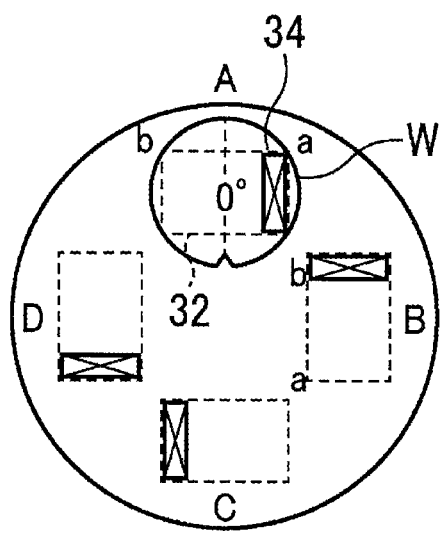
FIGS. 11A to 11D are schematic diagrams showing an example in which oscillation of the magnet and revolution of the substrate are synchronized in the case of different target arrangements.
Figure 11B:
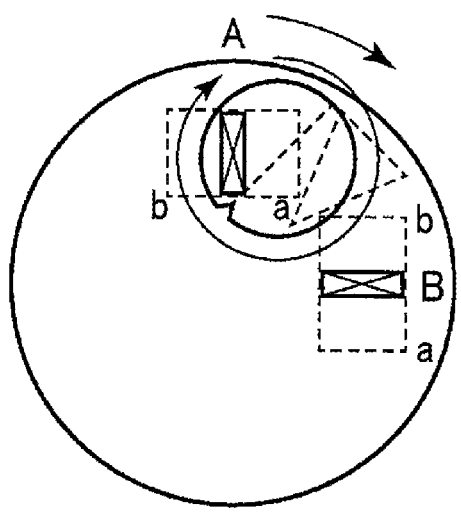
Figure 11C:
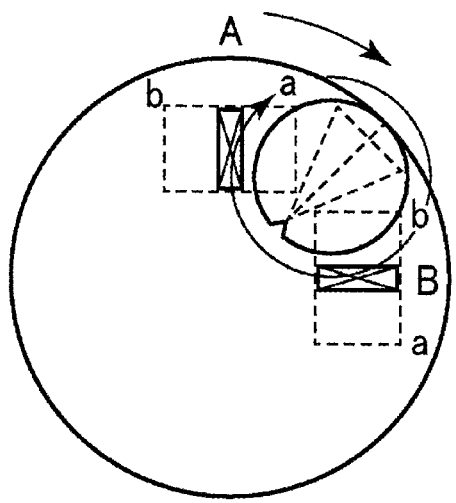
Figure 11D:
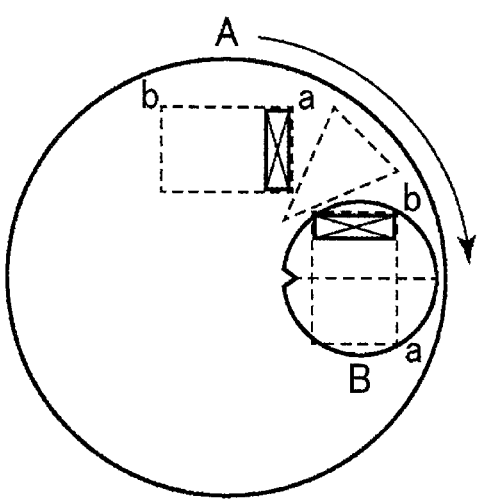

FIG. 9 shows a detailed timing example of the oscillation of the magnet 34 and the rotation and revolution of the substrate W at this time. In this example, the magnet 34 is oscillated so as to synchronize with the revolution of the substrate W and such that the magnets 34 are in opposite positions for the target A and the target B. As shown in FIGS. 10A to 10C, in the initial state, in the target A, the film thickness on the substrate W is thicker on the side of one end "a" where the magnet 34 exists (see FIG. 10A), and in the target B, the film thickness on the substrate W is thicker on the side of the other end "b" where the magnet 34 exists (see FIG. 10B). Therefore, by revolving the substrate W while rotating the substrate W, and by oscillating the magnets 34 in synchronization with the revolution so that the magnets 34 are in opposite positions for the target A and the target B as shown in FIG. 9, a uniform film thickness is obtained as shown in FIG. 10C.

Although the oscillation of the magnets 34 of the two targets in the case of revolving the substrate W by ¼ turn from the target A to the target B has been described, the revolution from the target B to the target C, the revolution from the target C to the target D, and the revolution from the target D to the target A are also exactly the same.

In addition, the uniformity of the film can be improved by rotating the substrate W an integral number of times (n times) while the substrate W revolves by ¼ turn. In other words, when there are four cathodes 30 as in this example, it is preferable to set the rotation speed of the substrate W to 4×n (n is an integer) times the revolution speed thereof.

Even when the target 32 is placed horizontally as shown in FIG. 5, the oscillation of the magnet 34 and the revolution of the substrate W can be synchronized as shown in FIGS. 11A to 11D, for example.

In the present embodiment, the film formed by sputtering is not particularly limited, but an Si film can be given as an example. When the film formed by sputtering is an Si film, for example, the Si film is oxidized to form an $SiO_2$ film by performing oxidation treatment in the reaction treatment area 40, and is nitrided to form an SiN film by performing nitriding treatment in the reaction treatment area 40.

Figure 12:
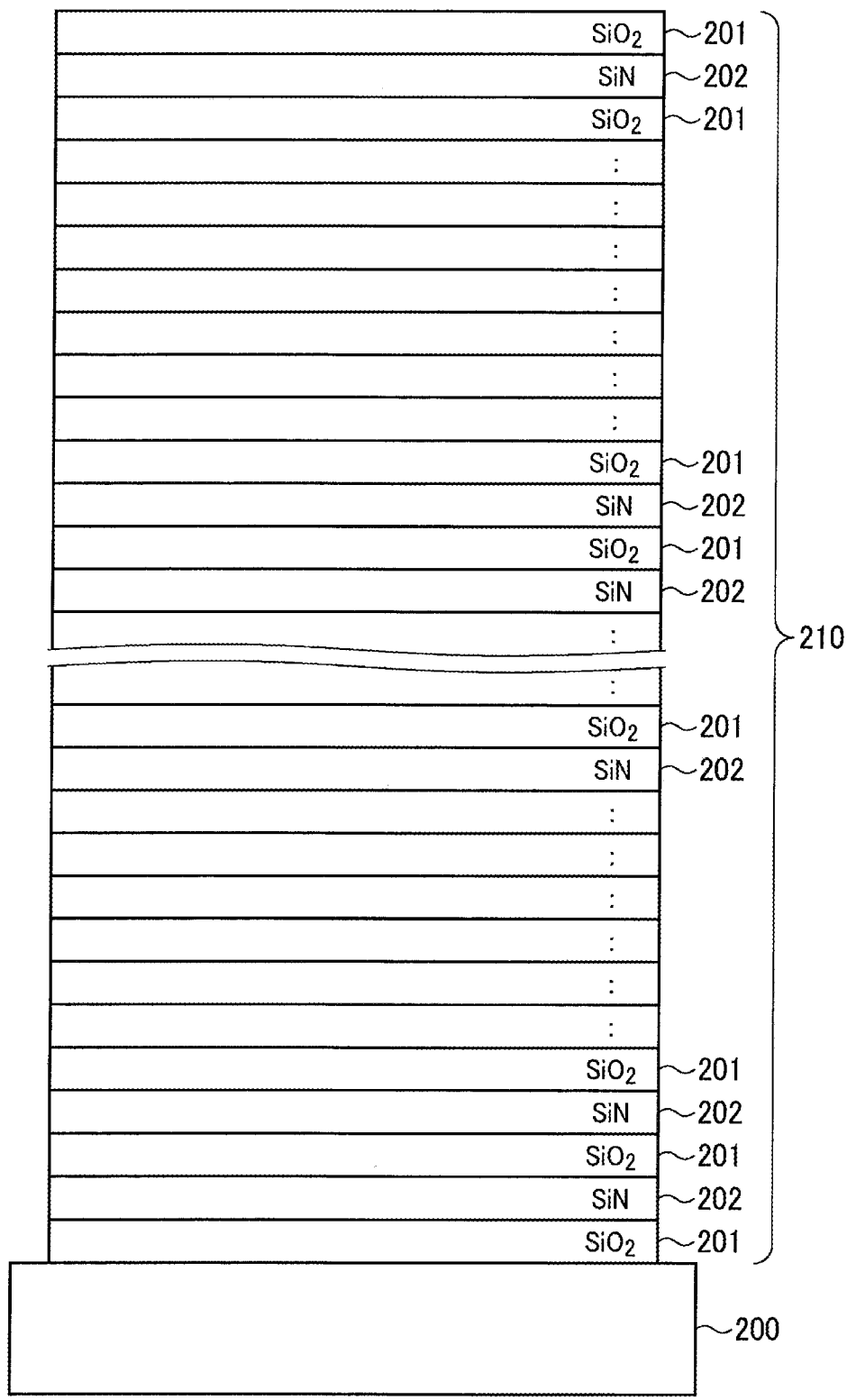
FIG. 12 is a cross-sectional view showing a laminated structure in which SiO2 films and SiN films are alternately laminated in a desired number of layers on a base according to the embodiment.

When an Si film is formed by sputtering and the oxidation treatment and the nitriding treatment are alternately performed in the reaction treatment area, as shown in FIG. 12, a laminated structure 210 can be formed by alternately laminating a desired number of $SiO_2$ films 201 and SiN films 202 on a base 200 made of Si, for example. In other words, by revolving the substrate W by the rotary table 20 while rotating the substrate W, Si film formation in the film forming area, oxidation treatment in the reaction treatment area 40, Si film formation in the film forming area, and nitriding treatment in the reaction treatment area 40 can be sequentially and repeatedly performed on the substrate W, and the $SiO_2$ films and the SiN films can be alternately formed in a desired number of layers. For example, it is possible to manufacture over 100 layers of $SiO_2$/SiN laminated film used for a semiconductor memory.

In this way, since the $SiO_2$/SiN laminated film can be manufactured by repeating the Si film formation, the oxidation treatment, the Si film formation, and the nitriding treatment while the plurality of substrates W is rotating and revolving, it is extremely efficient and can achieve high throughput. Further, since the $SiO_2$/SiN laminated film can be collectively manufactured in one processing container without transferring the substrates W, the generation of particles can be reduced. Moreover, since sputtering film formation, oxidation treatment, and nitriding treatment are performed on the substrates W while rotating and revolving the plurality of substrates W arranged in a circular shape, the controllability of the film thickness or the like is high.

On the other hand, Japanese Laid-open Patent Publication No. H10-298752 only discloses that sputtering film formation is performed while a plurality of substrates are held by a substrate holder, and does not consider collective manufacture of $SiO_2$/SiN laminated film. In addition, the formation of an $SiO_2$ film and the formation of an SiN film are conventionally mainly performed by CVD, and a batch type or single-wafer type apparatus is used. However, in any case, in order to manufacture the $SiO_2$/SiN laminated film, it is necessary to use separate processing containers for the film forming processes of an $SiO_2$ film and an SiN film, respectively, and it is necessary to transfer the substrate between the processing containers. Hence, the productivity decreases, and particles may be generated during the transfer.

In the present embodiment, as described above, since the substrate is not transferred on the way, the $SiO_2$/SiN laminated film can be manufactured with high efficiency and high throughput (productivity) and with extremely low risk of particles.

In addition, in the present embodiment, the reaction treatment area 40 is provided between the cathodes 30, and the separation wall 27 and the exhaust slit 28 are provided between the adjacent stages 21 on the rotary table 20 to isolate the atmospheres of the adjacent substrates W. Accordingly, the oxidation of the target 32 or the like can be prevented.

In addition, since the target 32 can be opened and closed by the shutter 36, when reaction treatment such as oxidation treatment or nitriding treatment is performed in the reaction treatment area 40, by closing the shutter 36, the surface of the target 32 can be prevented from being oxidized or nitrided. Further, pre-sputtering can be performed by introducing Ar gas into the processing container 10 and applying a voltage to the target 32 while the shutter 36 is closed. Accordingly, an oxide film and a nitride film formed on the outermost surface of the target 32 can be removed.

Some of the targets 32 may be used for pasting to enable pasting. When performing sputtering film formation, sputtered metals and metal oxides oxidized from the sputtered metals adhere to the members in the processing container 10 and the inner wall of the processing container 10, and there is a risk that the adhered substances may peel off and become particles. In such a case, by performing pasting in which a voltage is applied to the target for pasting and then sputtering is performed, the adhered substances adhered to the inside of the processing container 10 are covered with a metal. Accordingly, the generation of particles can be suppressed. The target for pasting includes Ti, SiC, Ta, or the like.

Figure 13:
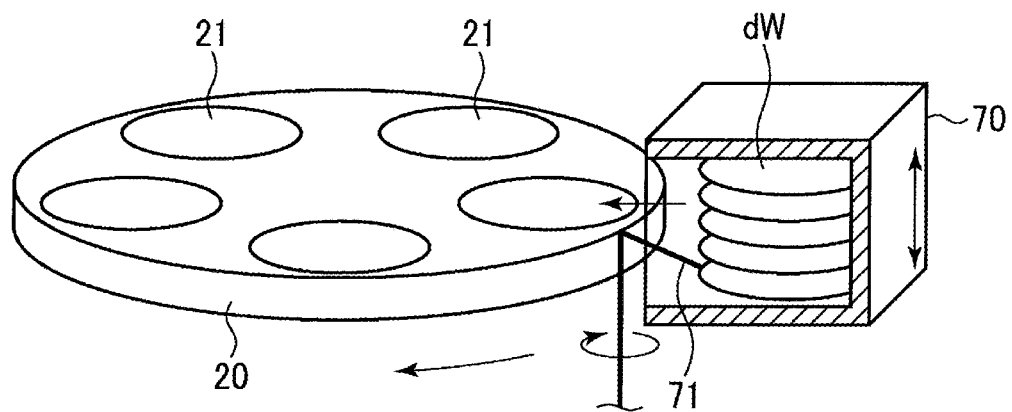
FIG. 13 is a perspective view for explaining a mechanism for placing a dummy substrate used for pasting on the stage.

The pasting is performed with a dummy substrate placed on the stage 21. FIG. 13 shows an embodiment including a mechanism for placing a dummy substrate for pasting on the stage 21. As shown in FIG. 13, in the present embodiment, a dummy substrate storage container 70 for accommodating dummy substrates is arranged adjacent to the rotary table 20. The dummy substrate storage container 70 is provided so as to be able to move up and down, and is configured to accommodate therein a plurality of dummy substrates dW in a stacked state. A dummy substrate transfer arm 71 is provided adjacent to the dummy substrate storage container 70, and the dummy substrate dW is transferred to each stage 21 by the dummy substrate transfer arm 71 while the dummy substrate storage container 70 is raised and lowered.

Next, another example of the target will be described.

Figure 14:
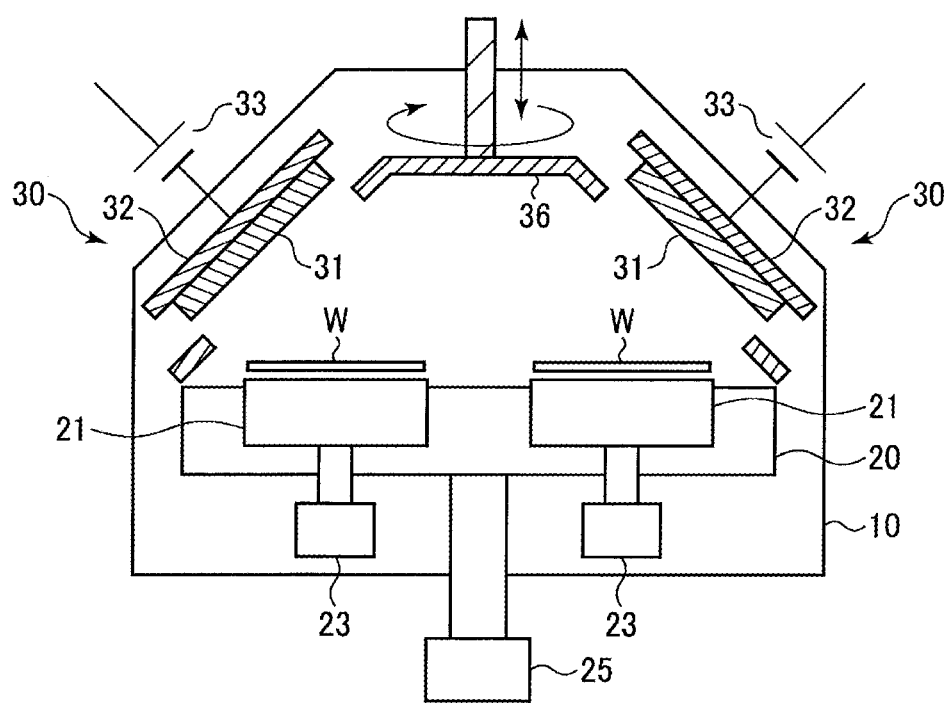
FIG. 14 is a cross-sectional view showing another example of the target.

The example of FIG. 14 is an example in which the top wall of the processing container 10 is conical and the target 32 is obliquely arranged with respect to the substrate W. By arranging the target 32 obliquely in this manner, particles of the target can be obliquely incident on the substrate W for deposition. Accordingly, it is possible to easily adjust the film thickness distribution and form a uniform film.

Figure 15:
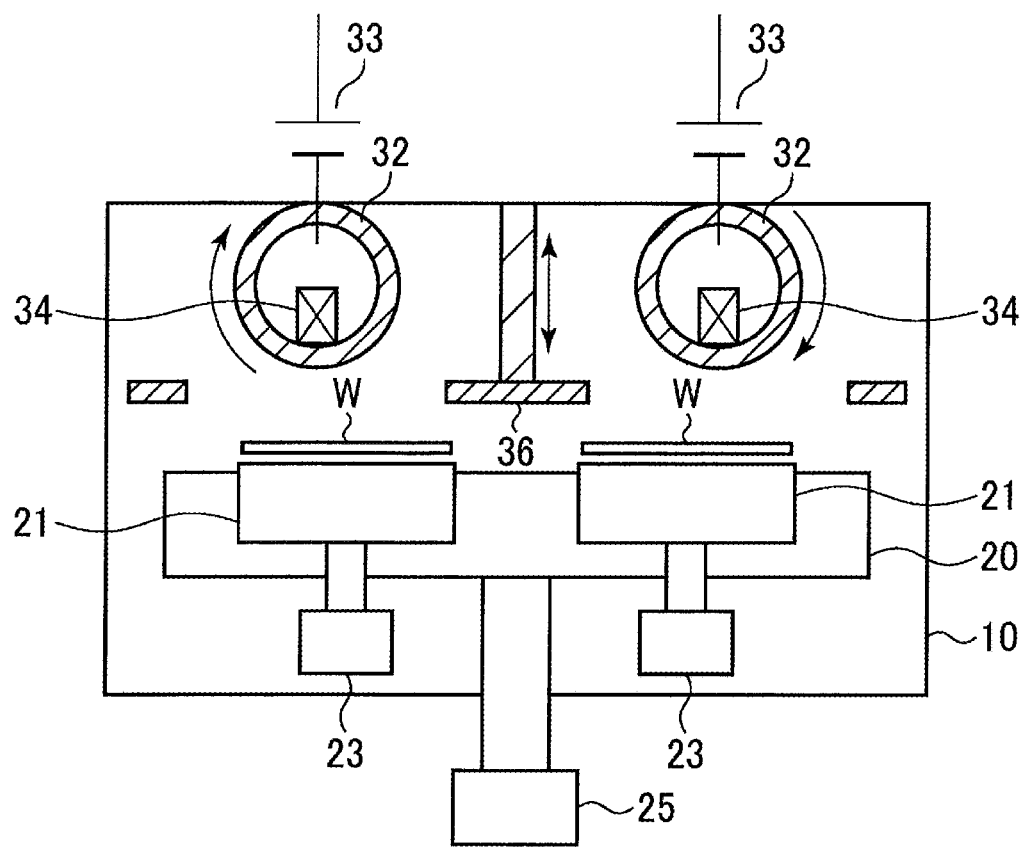
FIG. 15 is a cross-sectional view showing still another example of the target.

The example of FIG. 15 is an example in which the target 32 is cylindrical. In this example, the cylindrical target 32 is arranged such that its axis is parallel to the substrates W, and is configured to rotate about its axis. The magnet 34 is provided inside the cylindrical target 32. By configuring the target 32 in this manner, the lifespan of the target 32 can be extended and the productivity can be improved.

Although the embodiments have been described above, the embodiments disclosed this time should be considered as examples and not restrictive in all respects. The above-described embodiments may be omitted, replaced, or modified in various forms without departing from the scope of the appended claims and the gist thereof.

For example, the configuration of the cathode that emits sputtered particles in the above embodiment is an example, and the sputtered particles may be emitted by other methods.

In addition, in the above embodiments, an example in which four cathodes are provided has been described, but the present disclosure is not limited thereto. In order to perform uniform sputtering film formation, it is preferable that the number of targets is two or more, more preferably four or more.

Further, in the above embodiments, an Si film is exemplified as a film formed by sputtering film formation, and the example of repeating the process of forming an $SiO_2$ film by oxidation treatment after forming an Si film and the process of forming an SiN film by nitriding treatment after forming an Si film has been described, but the present disclosure is not limited thereto. In other words, a film to be formed may be made of materials other than Si, the reaction treatment is not limited to repeating oxidation treatment and nitriding treatment, and the reaction treatment may be oxidation treatment only, nitriding treatment only, or other reaction treatment such as carbonization.

In sputtering film formation using a cathode, it is not necessary to form one type of film, and multiple types of films may be formed. Alternatively, only sputtering film formation using a cathode may be performed without providing the reaction treatment area.

Figure 16A:
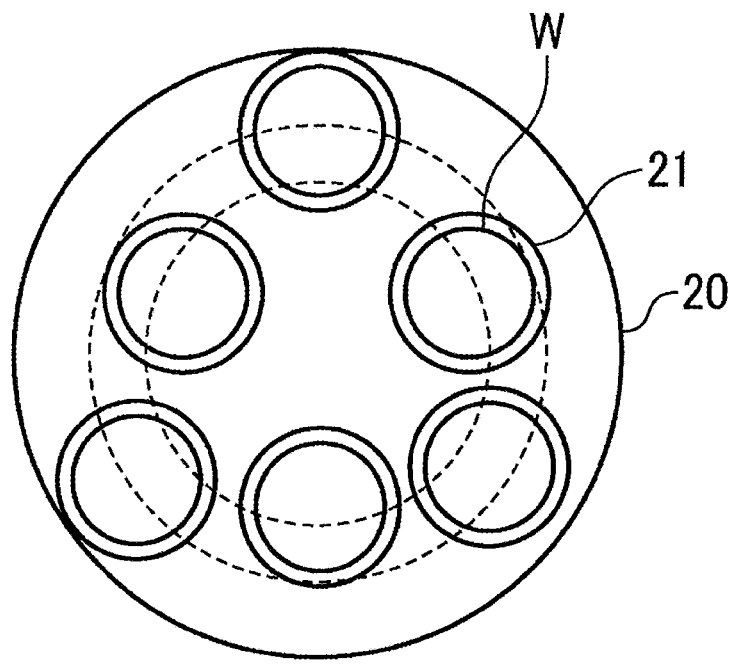
FIGS. 16A and 16B are plan views showing an example in which the stages are arranged in two or more lines in a circumferential direction.
Figure 16B:
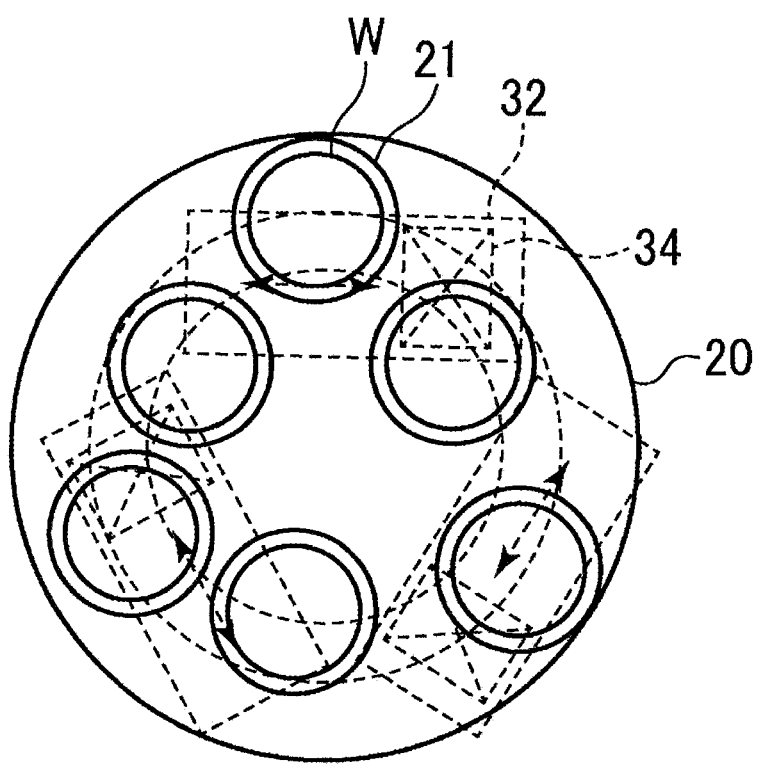

Further, in the above embodiment, the case in which five substrates are processed at the same time has been described, but the number of substrates is not limited as long as the number of substrates is plural. From the viewpoint of productivity, four or more substrates are preferable. Further, although the example in which the stages on which the substrates are placed are arranged in one line in the circumferential direction has been described, the stages may be arranged in two or more lines in the circumferential direction. Here, arranging the stages in two or more lines means arranging the stages in a plurality of lines having different revolution radii, and an example as shown in FIGS. 16A and 16B can be given, for example. In this example, as shown in FIG. 16A, three stages 21 on the outer peripheral side and three stages 21 on the inner peripheral side are provided on the rotary table 20 at regular intervals. The revolving trajectories of the stages 21 are marked with dashed lines in the drawing to indicate that they have different revolution radii. At this time, for example, as shown in FIG. 16B, the targets 32 and the magnets 34 are preferably arranged so as to cover the substrates W placed on the stages 21 on the outer peripheral side and the stages 21 on the inner peripheral side.

Although the rectangular and cylindrical shapes have been exemplified as the shapes of the targets, the shapes of the targets are not limited to these, and the shapes of the targets may be, for example, polygons other than rectangle.

In the above embodiments, the example of using the rotary table that rotatably holds the plurality of stages as the revolving mechanism for revolving the substrate has been described, but the present disclosure is not limited thereto, and for example, the plurality of stages may be held by arms and revolved.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus comprising:
a processing container for accommodating a plurality of substrates,
a substrate holder horizontally disposed in the processing container and configured to hold the substrates, wherein a plurality of stages are arranged along a circumferential direction on the substrate holder, the stages supporting the substrates, and wherein a separation wall and an exhaust slit are provided between adjacent stages on the substrate holder, and the adjacent stages are physically separated by the separation wall;
a rotating and revolving mechanism configured to rotate the plurality of substrates on the substrate holder and revolve the plurality of substrates on the substrate holder along the circumferential direction; and
a sputtered particle emitting mechanism configured to emit sputtered particles to the plurality of substrates held by the substrate holder,
wherein sputtering film formation is performed by emitting the sputtered particles from the sputtered particle emitting mechanism while rotating and revolving the plurality of substrates held by the substrate holder using the rotating and revolving mechanism.

2. The film forming apparatus of claim 1, wherein the sputtered particle emitting mechanism has a plurality of cathodes each having a target that emit sputtered particles.

3. The film forming apparatus of claim 2, further comprising:
a reaction treatment area provided between the cathodes adjacent to each other, where reaction treatment is performed on a film formed on the substrate by the sputtering film formation.

4. The film forming apparatus of claim 3, wherein the reaction treatment is oxidation treatment or nitriding treatment.

5. The film forming apparatus of claim 3, wherein the sputtered particle emitting mechanism has a shutter configured to open and close the target, and the shutter is opened during the sputtering film formation.

6. The film forming apparatus of claim 5, wherein the shutter has an opening, the opening is located at a position corresponding to the target during the sputtering film formation and is shifted from the target during the reaction treatment.

7. The film forming apparatus of claim 5, wherein the cathodes perform pre-sputtering in a state where the shutter is closed.

8. A film forming apparatus comprising:
a processing container for accommodating a plurality of substrates;
a substrate holder horizontally disposed in the processing container and configured to hold the substrates, wherein a plurality of stages are arranged along a circumferential direction on the substrate holder, the stages supporting the substrates, and wherein a separation wall and an exhaust slit are provided between adjacent stages on the substrate holder, and the adjacent stages are physically separated by the separation wall;
a rotating and revolving mechanism configured to rotate the plurality of substrates on the substrate holder and revolve the plurality of substrates on the substrate holder along the circumferential direction;
a sputtered particle emitting mechanism having a plurality of cathodes each having a target that emit Si as sputtered particles to the plurality of substrates held by the substrate holder, and configured to form an Si film on the substrates;
an oxidation treatment area provided between the cathodes adjacent to each other, where oxidation treatment is performed on the Si film on the substrate; and
a nitriding treatment area provided between the cathodes adjacent to each other, where nitriding treatment is performed on the Si film on the substrate,
wherein a laminated film of $SiO_2$ films and SiN films is formed by sequentially and repeatedly performing, on each of the substrates, the formation of the Si film using the cathodes, the oxidation treatment of the Si film in the oxidation treatment area, the formation of the Si film using the cathodes, and the nitriding treatment of the Si film in the nitriding treatment area while rotating and revolving the plurality of substrates held by the substrate holder using the rotating and revolving mechanism.

9. The film forming apparatus of claim 8, wherein the sputtered particle emitting mechanism has a shutter configured to open and close the target, and the shutter is opened during the sputtering film formation.

10. The film forming apparatus of claim 9, wherein the shutter has an opening, and the opening is located at a position corresponding to the target during the sputtering film formation, and is shifted from the target during the oxidation treatment and the nitriding treatment.

11. The film forming apparatus of claim 2, wherein the cathode has a magnet provided to oscillate on a back surface of the target.

12. The film forming apparatus of claim 11, wherein the magnet oscillates in synchronization with the revolution of the plurality of substrates.

13. The film forming apparatus of claim 2, wherein the target is disposed obliquely with respect to the substrates.

14. The film forming apparatus of claim 2, wherein the target has a cylindrical shape, is arranged with its axis parallel to the substrate, and is configured to rotate about the axis.

15. A film forming method for forming a film using a film forming apparatus including a processing container for accommodating a plurality of substrates; a substrate holder horizontally disposed in the processing container and configured to hold the substrates, wherein a plurality of stages are arranged along a circumferential direction on the substrate holder, the stages supporting the substrates, and wherein a separation wall and an exhaust slit are provided between adjacent stages on the substrate holder, and the adjacent stages are physically separated by the separation wall; a rotating and revolving mechanism configured to rotate the plurality of substrates on the substrate holder and revolve the plurality of substrates on the substrate holder along the circumferential direction; and a sputtered particle emitting mechanism configured to emit sputtered particles to the plurality of substrates held by the substrate holder,
the method comprising:
loading the plurality of substrates into the processing container and holding the substrates on the substrate holder;
rotating and revolving the plurality of substrates held by the substrate holder using the rotating and revolving mechanism; and performing sputtering film formation by emitting sputtered particles from the sputtered particle emitting mechanism while rotating and revolving the plurality of substrates.

16. The film forming method of claim 15, wherein the sputtered particle emitting mechanism includes a plurality of cathodes each having a target that emit sputtered particles, and a reaction treatment area where reaction treatment is performed on a film formed on the substrate by the sputtering film formation is provided between the cathodes adjacent to each other, the method further comprising:
performing reaction treatment on the film in the reaction treatment area after the sputtering film formation.

17. The film forming method of claim 16, wherein the reaction treatment is oxidation treatment or nitriding treatment.

18. The film forming method of claim 15, wherein the sputtered particle emitting mechanism includes a plurality of cathodes each having a target that emit sputtered particles, the film formed by said performing the sputtering film formation is an Si film, an oxidation treatment area and a nitriding treatment area are provided as the reaction treatment area between the cathodes adjacent to each other, the method further comprising:
performing oxidation treatment on the Si film in the oxidation treatment area after the sputtering film formation; and performing nitriding treatment on the Si film in the nitriding treatment area after the sputtering film formation, and wherein a laminated film of $SiO_2$ films and SiN films is formed by sequentially repeating said performing the sputtering film formation, said performing the oxidation treatment, said performing the sputtering film formation, and said performing the nitriding treatment while rotating and revolving the plurality of substrates.

* * * * *